(12) United States Patent
Braun et al.

(10) Patent No.: US 6,424,558 B2
(45) Date of Patent: Jul. 23, 2002

(54) FERROELECTRIC MEMORY ARRAY COMPOSED OF A MULTIPLICITY OF MEMORY CELLS EACH HAVING AT LEAST ONE SELECTION TRANSISTOR AND ONE STORAGE CAPACITOR DRIVEN VIA WORD LINES AND BIT LINES

(75) Inventors: Georg Braun, München (DE); Heinz Hönigschmid, East Fishkill, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/767,804

(22) Filed: Jan. 22, 2001

Related U.S. Application Data

(63) Continuation of application No. PCT/DE99/02071, filed on Jul. 5, 1999.

(30) Foreign Application Priority Data

Jul. 22, 1998 (DE) .......................................... 198 32 994

(51) Int. Cl.⁷ ................................................ G11C 11/22
(52) U.S. Cl. ...................... 365/145; 365/149; 365/117; 365/189.01
(58) Field of Search ................................. 365/145, 149, 365/203, 117, 189.01

(56) References Cited

U.S. PATENT DOCUMENTS

| | | | |
|---|---|---|---|
| 4,999,519 A | | 3/1991 | Kitsukawa et al. |
| 5,151,622 A | | 9/1992 | Thrower |
| 5,224,069 A | | 6/1993 | Natori |
| 5,424,975 A | * | 6/1995 | Lowrey ....................... 365/145 |
| 5,455,786 A | | 10/1995 | Takeuchi et al. |
| 5,959,878 A | * | 9/1999 | Kamp ........................ 365/117 |
| 6,147,895 A | * | 11/2000 | Kamp ........................ 365/145 |
| 6,256,220 B1 | * | 7/2001 | Kamp ........................ 365/145 |

FOREIGN PATENT DOCUMENTS

| | | |
|---|---|---|
| EP | 0 311 088 A2 | 4/1989 |
| WO | WO 99/14761 | 3/1999 |

\* cited by examiner

*Primary Examiner*—David Nelms
*Assistant Examiner*—Gene N. Auduong
(74) *Attorney, Agent, or Firm*—Laurence A. Greenberg; Werner H. Stemer; Ralph E. Locher

(57) ABSTRACT

A ferroelectric storage assembly containing a storage cell array composed of a plurality of storage cells is described. Each storage cell contains at least one selector transistor and a storage capacitor, and can be controlled via word lines and bit lines. A short-circuit transistor is located over each storage capacitor in order to protect the storage.

5 Claims, 4 Drawing Sheets

FERROELECTRIC MEMORY ARRAY COMPOSED OF A MULTIPLICITY OF MEMORY CELLS EACH HAVING AT LEAST ONE SELECTION TRANSISTOR AND ONE STORAGE CAPACITOR DRIVEN VIA WORD LINES AND BIT LINES

CROSS-REFERENCE TO RELATED APPLICATION

This application is a continuation of copending International Application No. PCT/DE99/02071, filed Jul. 5, 1999, which designated the United States.

BACKGROUND OF THE INVENTION

Field of the Invention

The present invention relates to a ferroelectric memory array having a memory cell field composed of a multiplicity of memory cells which each have at least one selection transistor and one storage capacitor and can be driven via word lines and bit lines.

It is known that the nonvolatility of ferroelectric memory arrays is based on a ferroelectric effect in which the polarization of dipoles within an insulator is retained despite the absence of an external electrical field. In other words, the retention of the stored information has the effect that an electrical field cannot be applied to a storage capacitor of the memory array.

However, in integrated circuits, it is not possible to avoid a situation in which small voltage differences occur at the electrodes of ferroelectric storage capacitors particularly due to parasitic components. The components increase or attenuate the polarization of the dielectric depending on the polarization of the dielectric of the storage capacitor and depending on the polarity of the voltage differences.

The voltage differences can also be referred to as interference pulses. The stored information is thus attenuated to a greater or lesser degree depending on the number and/or the amplitude of the interference pulses. In the worst case, incorrect evaluation may even occur during the reading of the memory array, which in practical terms is equivalent to a data loss.

This will be explained in more detail below with reference to a hysteresis curve of a ferroelectric storage capacitor. The hysteresis curve shows that when a voltage V=0 is applied two polarization states which can store information are produced. If the polarization migrates from a first point to a second point due to an interference pulse, for example, and if, after the decaying of the interference pulse, the voltage is 0 again, the polarization does not return to the first point but rather migrates to a third point, which lies below the first point. A plurality of interference pulses can thus ultimately cause the information to be lost.

The coupling of interference pulses while a memory array is operating also depends on the concept that has been applied for the memory array.

In the so-called VDD/2 concept, interference pulses are generated in particular by the capacitive coupling of voltage fluctuations at a common electrode of all the ferroelectric storage capacitors, for example when the memory array is switched on and off, and by a leakage current from disabled PN junctions.

With respect to the pulse concept, capacitive coupling of a pulsed electrode rail onto memory cells that have not been selected is a particular cause of interference pulses.

Furthermore, in the VDD/2 and pulse concept, charge injection and capacitive coupling of the selector transistor or transfer gate give rise to interference pulses.

Finally, in the NAND concept, the voltage drop across the transistors resulting from the current that flows during the reading and writing of a memory cell causes interference pulses.

In the VDD/2 concept there are two approaches to solving the leakage current problem: both are based on the fact that the charge which flows away through the disabled PN junction is replenished either continuously or cyclically by the selector transistor of the memory cell. However, it is possible to switch on the selector transistors continuously only as long as the memory array is not being accessed. However, if the memory array is in fact accessed, just one word line of the memory cell field may be active, while all the other word lines must be switched off. After the memory access, all the word lines must then be switched on again, which gives rise to a large increase in the power requirement due to the high capacitive load. Cyclical switching on of the selector transistors also has the disadvantage that the leakage current gives rise to interference pulses at the storage capacitors between the cycles and these interference pulses can at most be limited in terms of their amplitude. An aggravating factor is that the leakage current of a disabled PN junction is not only subject to severe fluctuations but also rises considerably with the temperature.

In the pulse concept, in order to save chip area and keep the memory array as small as possible, usually twice as many storage capacitors are connected to a common electrode rail than are addressed during a reading or writing access. In order to avoid this, the area of a memory cell would have to be substantially increased, which is, however, not a desirable aim for reasons of costs.

In a NAND-like configuration of the memory cells that can also be used in combination with the VDD/2 concept, the leakage current problem of disabled PN junctions is solved. However, interference pulses occur at the adjacent cells due to the finite resistance of the transistors during the reading or writing of the memory cells.

There is at the moment still no satisfactory solution for the problem of charge injection and capacitive coupling of the selector transistors which occurs in the VDD/2 concept and pulse concept. However, this problem might create fewer difficulties in the future because the channel charge of field-effect transistors is continuing to decrease as the integration density increases.

An existing two-transistor/two-capacitor memory cell (2T2C memory cell) in which information is stored in a complementary fashion, has the advantage that no reference cell is required.

A single-transistor/single-capacitor memory cell (1T1C memory cell) can be used both for an "open" bit line configuration and for a "folded" bit line configuration. In both cases a reference voltage is necessary to evaluate a read signal.

Both the 2T2C memory cell and the 1T1C memory cell are suitable for the VDD/2 concept and for the pulse concept.

In all memory arrays which use such memory cells, the above-mentioned problems owing to interference pulses occur irrespective of which concept the memory array is based on.

SUMMARY OF THE INVENTION

It is accordingly an object of the invention to provide a ferroelectric memory array that overcomes the above-mentioned disadvantages of the prior art devices of this general type, in which information losses caused by interference pulses are reliably avoided.

With the foregoing and other objects in view there is provided, in accordance with the invention, a ferroelectric memory array. The ferroelectric memory array has a memory cell field containing a multiplicity of memory cells. Each of the memory cells has at least one selector transistor with a control terminal, a short-circuit transistor with a controllable path and a control terminal, and a storage capacitor with electrodes. The controllable path of the short-circuit transistor is disposed between the electrodes of the storage capacitor. The short-circuit transistor has a different switch-on voltage than the selector transistor. Word lines are connected to and drive the memory cells. More specifically, the word lines are connected to the control terminal of the selector transistor and to the control terminal of the short-circuit transistor. Bit lines are provided and are connected to the memory cells.

In order to achieve this object, a ferroelectric memory array of the type specified at the beginning is characterized according to the invention by a short-circuit transistor which is located above each storage capacitor and short-circuits the electrodes of the storage capacitor.

In order to avoid disadvantageous influences of the interference pulses, an additional transistor is therefore provided for each ferroelectric storage capacitor in the memory array according to the invention, the additional transistor being capable of short-circuiting the electrodes of the ferroelectric storage capacitor. The additional transistor may either be of the same type as the selector transistor, that is to say, for example, a transistor of the enhancement type with a positive switch-on voltage in the case of N-type channel field-effect transistors or else, preferably, a transistor of the depletion type with a negative switch-on voltage in the case of N-type channel field-effect transistors. A transistor of the depletion type is particularly advantageous because it provides an effective protection for the ferroelectric storage capacitor both in the active operating state and in the switched-off state in the form of a Faraday cage.

If the switch-on voltage is carefully chosen, it is also possible to ensure that the memory array does not require any additional area in comparison to a one transistor, one capacitor (1T1C) memory cell.

The storage capacitor can be disposed as a stacked capacitor above the selector transistor or offset as an "offset", capacitor next to the selector transistor.

A method for operating the ferroelectric memory array is distinguished in that after a reading or writing process both electrodes of the storage capacitor are placed at the same potential by driving by the short-circuit transistor.

In accordance with an added feature of the invention, the selector transistor and the short-circuit transistor are alternately connected to the word lines and the word lines serves as both a word line and a control line.

In accordance with an additional feature of the invention, the short-circuit transistor is a depletion type field-effect transistor.

In accordance with another feature of the invention, the storage capacitor is a stacked capacitor disposed above the selector transistor. Alternatively, the storage capacitor is an offset capacitor disposed next to the selector transistor.

With the foregoing and other objects in view there is provided, in accordance with the invention, a ferroelectric memory array including a memory cell field containing a multiplicity of memory cells having selector transistors with control terminals, short-circuit transistors with controllable paths and control terminals, and storage capacitors with electrodes. Each of the controllable paths of the short-circuit transistors is disposed between respective ones of the electrodes of the storage capacitors. The short-circuit transistors have a different switch-on voltage than the selector transistors. Word lines are connected to and drive the memory cells, the word lines are connected to the control terminals of the selector transistor and to the control terminals of the short-circuit transistors. Bit lines are provided and are connected to the memory cells.

In accordance with a concomitant feature of the invention, the selector transistors and the short-circuit transistors are alternately connected to the word lines and the word lines serving as both a word line and a control line.

Other features which are considered as characteristic for the invention are set forth in the appended claims.

Although the invention is illustrated and described herein as embodied in a ferroelectric memory array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 10:
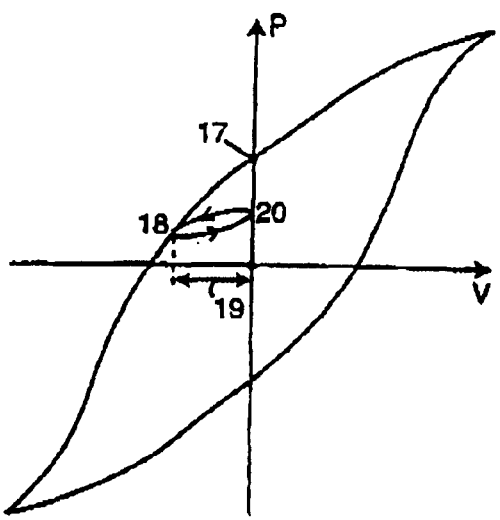
FIG. 10 is a graph of a hysteresis curve for a ferroelectric memory.

In all the figures of the drawing, sub-features and integral parts that correspond to one another bear the same reference symbol in each case. Referring now to the figures of the drawing in detail and first, particularly, to FIG. 10 thereof, there is shown a hysteresis curve of a ferroelectric storage capacitor. The hysteresis curve shows that when a voltage V=0 is applied two polarization states P which can store information are produced. If the polarization migrates from a point 17 to a point 18 due to an interference pulse 19, for example, and if, after the decaying of the interference pulse, the voltage is 0 again, the polarization does not return to the point 17 but rather migrates to a point 20, which lies below the point 17. A plurality of the interference pulses 19 can thus ultimately cause the information to be lost.

Figure 11:
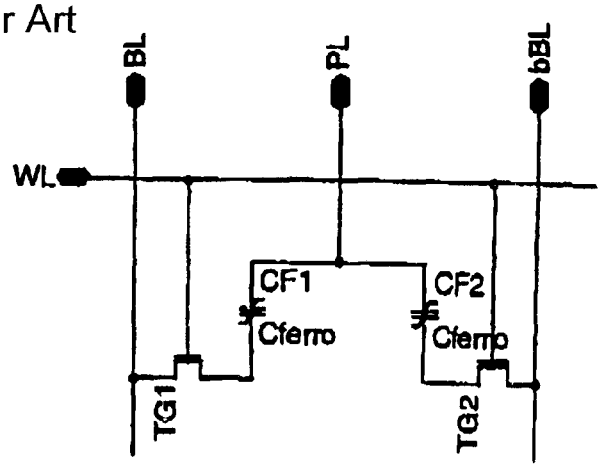
FIG. 11 is a circuit diagram of an existing 2T2C cell.

FIG. 11 shows an existing two-transistor TGi/two-capacitor CFi memory cell (2T2C memory cell) in which information is stored in a complementary fashion, which has the advantage that no reference cell is required.

Figure 12:
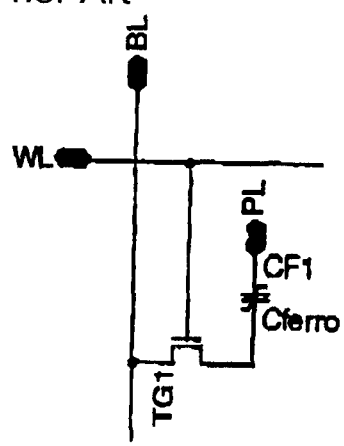
FIG. 12 is a circuit diagram of an existing 1T1C cell.

FIG. 12 shows a single-transistor TG1/single-capacitor CF1 memory cell (1T1C memory cell). The memory cell can be used both for an "open" bit line configuration and for a "folded" bit line configuration. In both cases a reference voltage is necessary to evaluate a read signal.

In particular, FIGS. 11 and 12 show word lines WL, bit lines BL and bBL, a supply line PL, ferroelectric storage capacitors CF1 and CF2 with a capacitance Cferro and selector transistors TG1, TG2.

In all the memory arrays which use such memory cells, the above-mentioned problems owing to interference pulses occur irrespective of which concept the memory array is based on.

Figure 1:
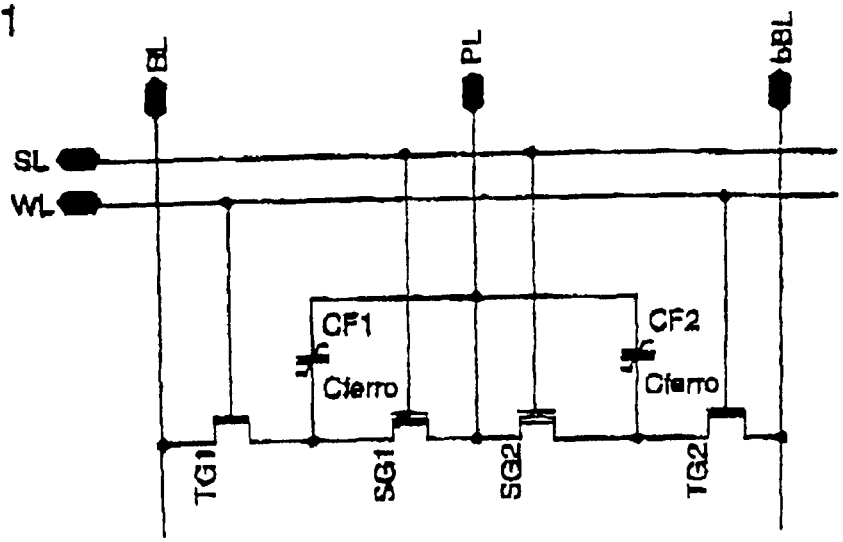
FIG. 1 is a circuit diagram of a ferroelectric memory array having a two-transistor, two-capacitor (2T2C) cell with short-circuit transistors according to a first exemplary embodiment of the invention.

This problem is solved with a circuit configuration according to the invention. In FIG. 1, there is shown a memory cell of a first exemplary embodiment of a ferroelectric memory array according to the present invention. The memory cell has, in addition to the existing memory cell shown in FIG. 11, short-circuit transistors SG1, SG2 which each bypass the storage capacitors CF1, CF2 with their source/drain paths and are driven by signals on a control line SL. The short-circuit transistors SG1, SG2 can be of the enhancement type or of the depletion type, but the depletion type is preferred because it ensures effective protection for the ferroelectric capacitor CF1 or CF2 both in the active operating state and in the switched-off state as a "Faraday" cage.

Figure 2:
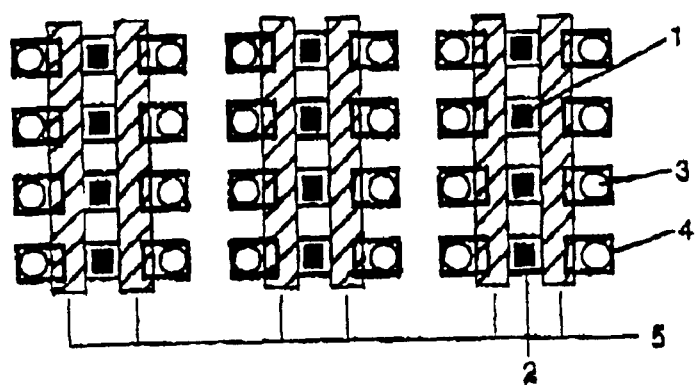
FIG. 2 is a schematic plan view of the 2T2C cell with 12 $F^2$ and a folded bit line.

FIG. 2 shows a plan view of the 2T2C memory cell with a folded bit line, specifically illustrating bit line contacts 1, an active area 2, a plug 3 for making contact, a bottom electrode 4 and word lines 5. A cell area required in this memory cell amounts to 12 $F^2$ if a contact with a bit line is used for two adjacent transfer gates, as is the case in dynamic memories. "F" is the abbreviation for "Feature Size" and constitutes the smallest structural size into which the respective process can be broken down.

FIGS. 2, 3, 6, 7 and 9 show memory arrays which are similar to one another, the bit lines having been omitted in these figures for the sake of better clarity. The bit lines run in the horizontal direction in the aforementioned figures, from bit line contact 1 to bit line contact 1 either via the bit line contacts which are shown as rectangles and which represent the lower electrode so that the capacitor is disposed under the bit line, or offset somewhat in the vertical direction, which permits a capacitor to be disposed either under the bit line or above the bit line.

Figure 3:
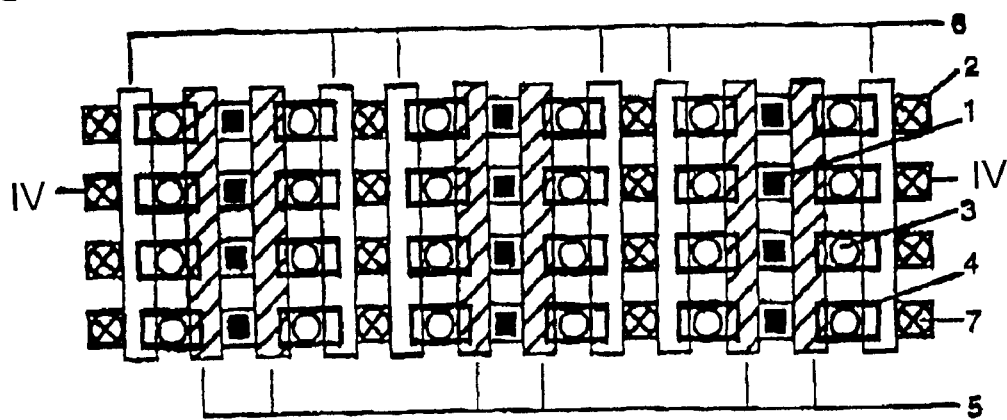
FIG. 3 is a schematic plan view of the 2T2C cell with 16 $F^2$, short-circuit transistors and the folded bit line.
Figure 6:
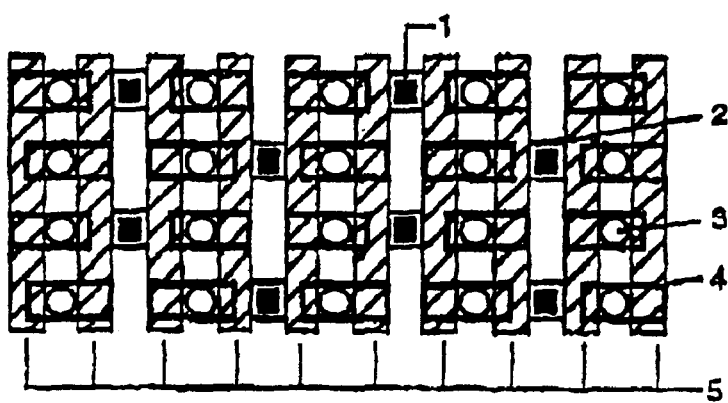
FIG. 6 is a schematic plan view of the 1T1C cell with the folded bit line.
Figure 7:
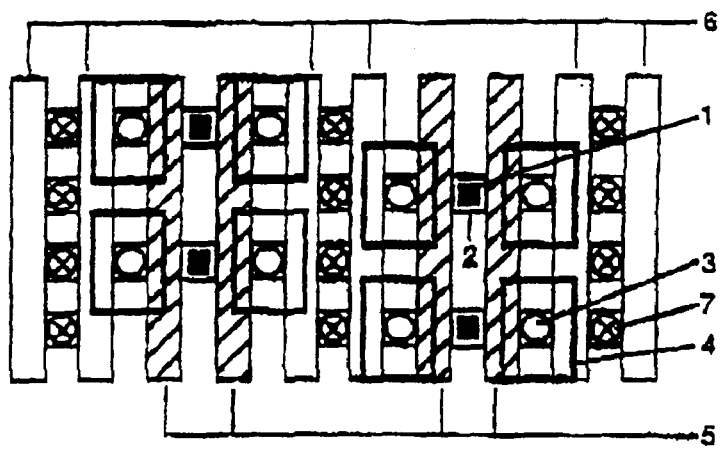
FIG. 7 is a schematic plan view of the 1T1C cell with 16 $F^2$, the short-circuit transistor and the folded bit line.
Figure 9:
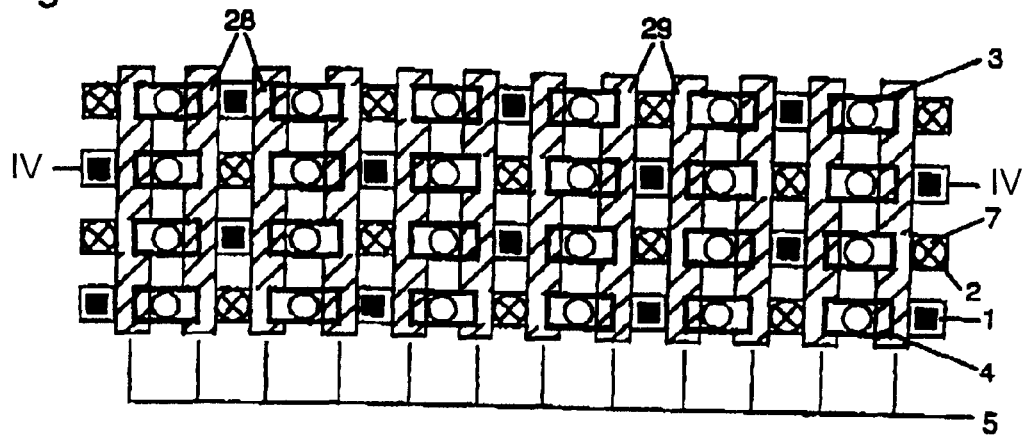
FIG. 9 is a schematic plan view of the 1T1C cells with 8 $F^2$, the short-circuit transistors and the folded bit line.

In particular, FIG. 3, which shows the two 2T2C cells, also shows short-circuit lines 6 and a plate contact 7. As already mentioned, FIG. 6 illustrates the 1T1C cell with the folded bit line and an area requirement of 8 $F^2$, and FIG. 7 illustrates the 1T1C memory cell with the short-circuit transistor and the folded bit line with a memory requirement of 16 $F^2$. Finally, FIG. 9 shows the 1T1C cell with the short-circuit transistor and the folded bit line and an area requirement of 8 $F^2$, field-effect transistors 28 of the enhancement type and field-effect transistors 29 of the depletion type being used here.

The introduction of the two short-circuit transistors SG1 and SG2 makes an additional contact from these transistors to the common electrode PL necessary. This contact can also be used jointly by the short-circuit transistors of two adjacent memory cells. Such a configuration is shown in FIG. 3, the cell area merely being increased from 12 $F^2$ to 16 $F^2$ here by the double use of the common contact.

Figure 4:
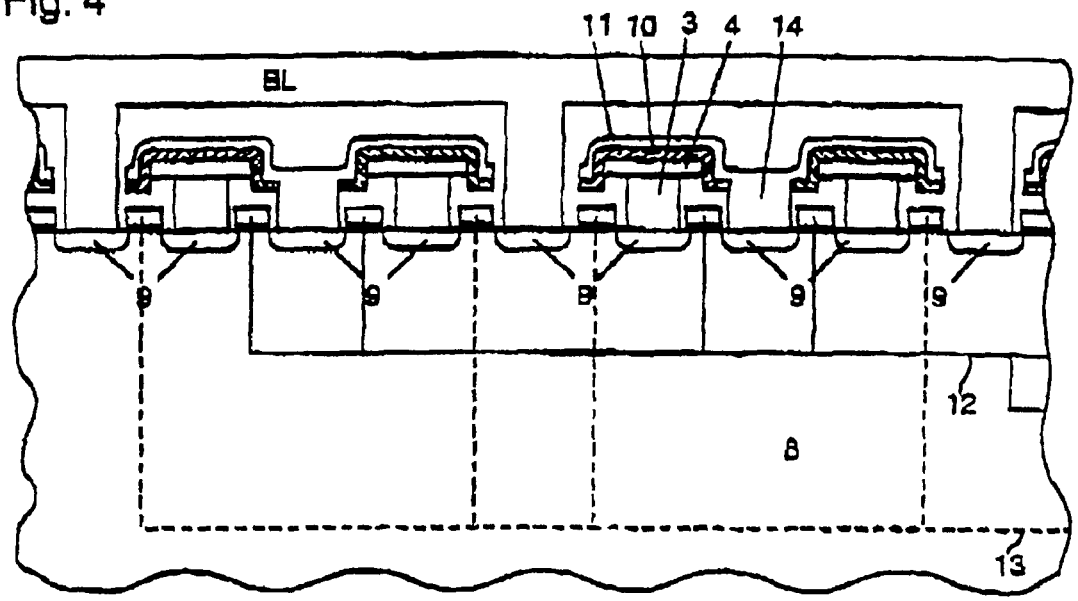
FIG. 4 is a diagrammatic, sectional view for the cell from FIGS. 3 and 9.

FIG. 4 shows a view of a section through the 2T2C memory cell with the short-circuit transistors in FIG. 3, the storage capacitor being placed under the bit line BL in FIG. 4. In addition, FIG. 4 also shows a semiconductor element 8, which is composed, for example, of p-type conductive silicon, $n^-$-type conductor zones 9, a ferroelectric dielectric 10 composed, for example, of strontium bismuth tantalate (SBT) or lead zirconium titanate (PZT), an upper electrode 11 and, schematically using unbroken lines, lines 12 which are short-circuit lines in the exemplary embodiment in FIG. 3 and word lines of the depletion type in the exemplary embodiment in FIG. 9, as well as word lines 13 of the enrichment type in the two exemplary embodiments in FIGS. 3 and 9. FIG. 4 shows here basically a section IV-IV through FIG. 3 and a section IV-IV through FIG. 9. Finally, FIG. 4 also shows a plate contact 14 for the common electrode.

It is possible to use the following process flow for the fabrication of the plate contacts 14.

After the ferroelectric dielectric 10 has been deposited, holes are etched for the plate contacts 14. Only after this are appropriate plate lines deposited and structured. As a result, separate filling in of the plate line contact holes in an additional process step can be avoided provided that the deposition process for the plate line is also suitable for filling in the contact holes.

Figure 5:
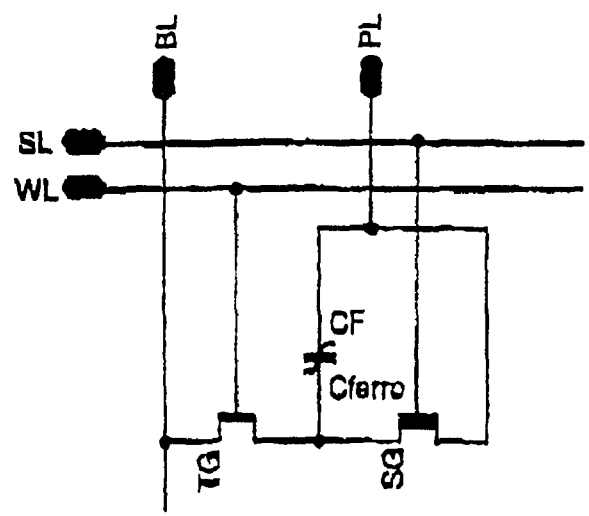
FIG. 5 is a circuit diagram of the ferroelectric memory array having the 1T1C cell with the short-circuit transistor according to a second exemplary embodiment of the invention.

FIG. 5 shows a circuit diagram of the 1T1C memory cell with the short-circuit transistor SG. Once again, a field-effect transistor of the enhancement type or of the depletion type may be used for the short-circuit transistor SG. The short-circuit transistor SG in turn bypasses both electrodes of the ferroelectric storage capacitor CF with its source/drain path, and is connected by its gate to the control line SL.

FIGS. 6 and 7, details of which have already been given above, show plan views of the 1T1C memory cell with the folded bit line and the 1T1C memory cell with the short-circuit transistor and the folded bit line. These figures show that the area requirement in the 1T1C memory cell with the short-circuit transistor has risen by a factor of 2 to 16 $F^2$ in comparison with the area requirement of the 1T1C memory cell with an area of 8 $F^2$.

This large area requirement of the 1T1C memory cell with short-circuit transistor according to FIG. 7 can, however, be drastically reduced if a field-effect transistor with a different switch-on voltage from the selector transistor or a field-effect transistor of the depletion type is used as the short-circuit transistor SG. In addition to the advantages of the "Faraday" cage which have already been mentioned above with regard to the field-effect transistor of the depletion type for the ferroelectric capacitor, it is then possible to combine the function of the word line and of the control line SL on one line. Such a memory cell array with the 1T1C memory cells with the short-circuit transistors and an area requirement of 8 $F^2$ is shown schematically in FIG. 8 with word lines WL0, WL1, WL2, WL3 and bit lines BL0, bBL0, BL1 and bBL1, the selector transistors TG and the short-circuit transistors SG and the storage capacitances Cferro. The memory cells are connected here to one another in such a way that both the selector transistors TG and the short-circuit transistors SG are connected to the line serving as the word line and as the control line. The selector transistors TG and the short-circuit transistors SG are alternately connected to this line here.

The plan view of FIG. 9 shows that the area requirement for the 1T1C memory cell with the short-circuit transistors is only 8 $F^2$. A sectional view taken along the line IV—IV of the memory cells shown in FIG. 9 is given again in FIG. 4.

Figure 8:
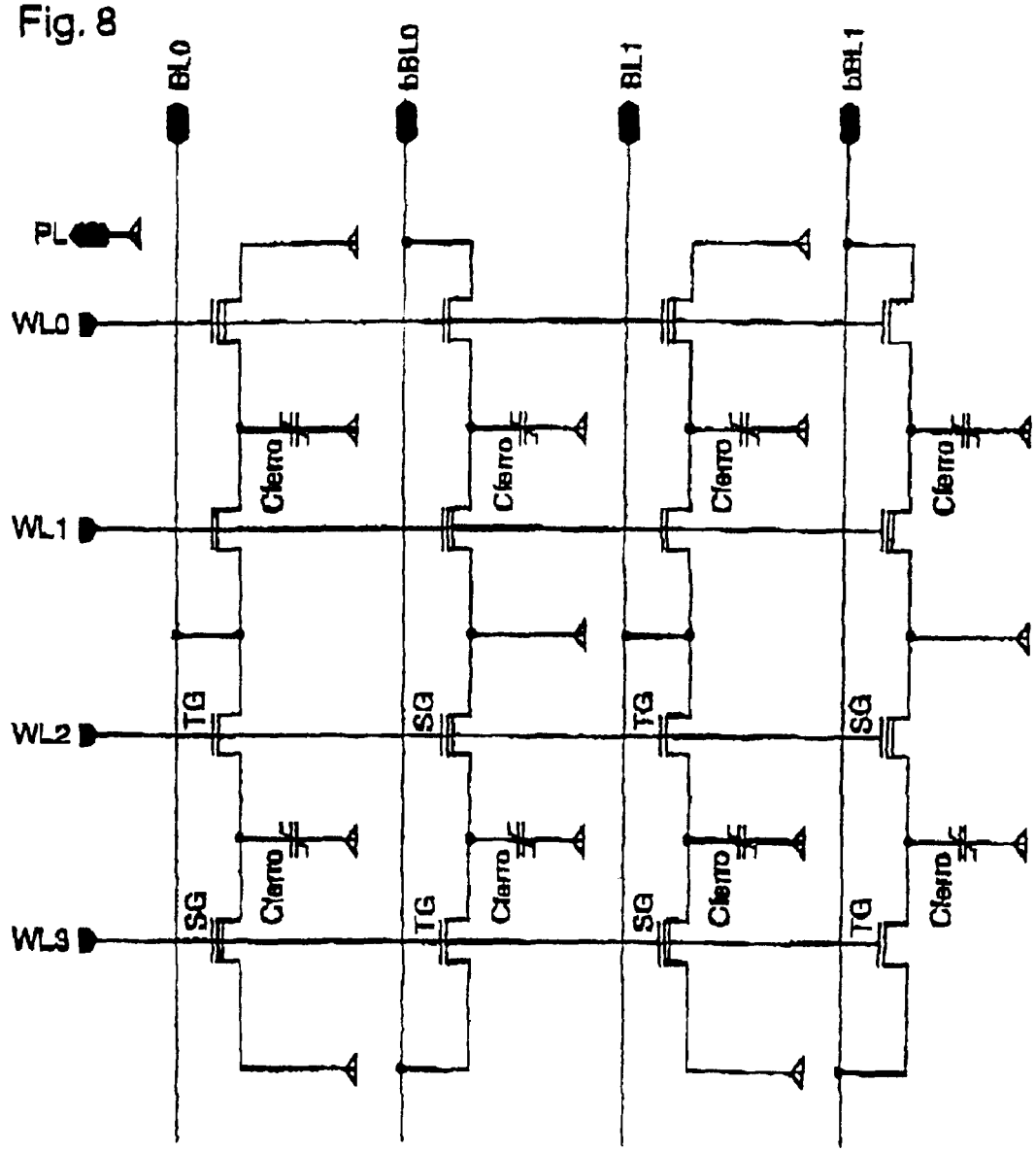
FIG. 8 is a circuit diagram of the memory array having the 1T1C cells with 8 $F^2$, short-circuit resistors and the folded bit line architecture.

The method of operation of the ferroelectric memory array for N-type channel field-effect transistors will be explained below with reference to FIG. 8. It is assumed here that the switch-on voltage of the field-effect transistors of the depletion type is more negative than the negative value of the voltage at the common electrode PL.

If the memory array is switched on, all the word lines WL are at 0 V. First, the common electrode PL is then driven from 0 V to the voltage VDD/2. Because the switch-on voltage of the field-effect transistors of the depletion type is selected to be appropriately highly negative, these field-effect transistors conduct even after the common electrode has been charged to VDD/2. All the electrodes of the ferroelectric storage capacitors are thus short-circuited.

In order to be able to access specific memory cells, the corresponding word line, that is to say for example the word line WL2, is charged from 0 V to the full supply voltage VDD or higher, as a result of which the desired ferroelectric capacitors are connected to the corresponding bit lines BL. If these bit lines are at a potential that is higher or lower than the potential of the common electrode PL, a charge compensation takes place between the selected ferroelectric capacitors and the associated bit lines BL. However, before this occurs, the short-circuit gates which short-circuit the selected capacitors must be switched off. This occurs as a result of a negative potential at the corresponding bit line, that is to say for example at the bit line WL3. This negative potential only switches off the desired field-effect transistors of the depletion type.

The field-effect transistors of the enhancement type, which are also connected to the word line WL3, have already been switched off by the standby potential of 0 V, and are only given a higher impedance as a result of the negative potential.

After the evaluation of the read signal and its amplification, the selected word line, for example the word line WL2, is finally discharged again to 0 V, which again disconnects the selected memory cells from the bit lines. In order once again to bring about the short-circuiting of the electrodes with the selected memory cells, the word line which is connected to the corresponding field-effect transistor of the depletion type, that is to say the word line WL3 in the present example, is returned to 0 V.

Another possibility is, for example, first to set the voltage at the common electrode on the bit lines, and then to switch on the short-circuit gate by placing the word line WL3 at 0 V. Finally, the word line WL2 is then discharged to 0 V in order to disconnect the selected memory cells again from the bit lines.

A significant advantage of the ferroelectric memory array according to the invention with the short-circuit transistors is the fact that the causes of interference pulses can be reliably avoided without additional space being required in the memory cell field. In addition, the field-effect transistor of the depletion type constitutes an ideal protection for the ferroelectric capacitor in its switched-off state.

A further advantage of the use of field-effect transistors of the depletion type lies in the fact that displacement of the hysteresis curve along the voltage axis due to aging occurs to a less pronounced degree if both electrodes of the ferroelectric storage capacitors are connected in a low impedance fashion in the standby mode and in the switched-off state of the memory array.

We claim:

1. The ferroelectric memory array, comprising:

a memory cell field containing a multiplicity of memory cells each having at least one selector transistor with a control terminal, a short-circuit transistor with a controllable path and a control terminal, and a storage capacitor with electrodes, said controllable path of said short-circuit transistor disposed between said electrodes of said storage capacitor, said short-circuit transistor having a different switch-on voltage than said selector transistor;

word lines connected to and driving said memory cells, said word lines alternately connected to said control terminal of said selector transistor and to said control terminal of said short-circuit transistor, said word lines serving as a word line for said selector transistor and as a control line for said short-circuit transistor; and bit lines connected to said memory cells.

2. The ferroelectric memory array according to claim 1, wherein said storage capacitor is an offset capacitor disposed next to said selector transistor.

3. The ferroelectric memory array according to claim 1, wherein said short-circuit transistor is a depletion type field-effect transistor.

4. The ferroelectric memory array according to claim 1, wherein said storage capacitor is a stacked capacitor disposed above said selector transistor.

5. A ferroelectric memory array, comprising:

a memory cell field containing a multiplicity of memory cells having selector transistors with control terminals, short-circuit transistors with controllable paths and control terminals, and storage capactiros with electrodes, each of said controllable paths of said short-circuit transistors disposed between respective ones of said electrodes of said storage capacitors, said short-circuit transistors having a different switch-on voltage than said selector transistors;

word lines connected to and driving said memory cells, said word lines alternately connected to said control terminal of said selector transistor and to said control terminal of said short-circuit transistor, said word lines serving as a word line for said selector transistor and as a control line for said short-circuit transistor; and bit lines connected to said memory cells.

* * * * *